(12) United States Patent
Wittmann (10) Patent No.: US 11,919,163 B2
(45) Date of Patent: Mar. 5, 2024

(54) METHOD FOR VALIDATING PROGRAMMED EXECUTION SEQUENCES OR TEACHING PROGRAMS FOR A ROBOT IN A WORKING CELL, AND A ROBOT AND/OR ROBOT CONTROLLER FOR SAID METHOD

(71) Applicant: WITTMANN TECHNOLOGY GMBH, Vienna (AT)

(72) Inventor: Peter Michael Wittmann, Leobendorf (AT)

(73) Assignee: WITTMANN TECHNOLOGY GMBH, Vienna (AT)

( * ) Notice: Subject to any disclaimer, the term of this patent is extended or adjusted under 35 U.S.C. 154(b) by 684 days.

(21) Appl. No.: 16/772,365

(22) PCT Filed: Dec. 5, 2018

(86) PCT No.: PCT/AT2018/060285
§ 371 (c)(1),
(2) Date: Jun. 12, 2020

(87) PCT Pub. No.: WO2019/113618
PCT Pub. Date: Jun. 20, 2019

(65) Prior Publication Data
US 2021/0069900 A1     Mar. 11, 2021

(30) Foreign Application Priority Data
Dec. 14, 2017   (AT) .............................. A 51032/2017

(51) Int. Cl.
*G06F 30/20* (2020.01)
*B25J 9/16* (2006.01)
*B29C 45/42* (2006.01)

(52) U.S. Cl.
CPC ............ *B25J 9/163* (2013.01); *B25J 9/1692* (2013.01); *B29C 45/4225* (2013.01); *G06F 30/20* (2020.01); *B29C 2045/4283* (2013.01)

(58) Field of Classification Search
CPC ............ G05B 2219/40321; G05B 2219/43166
(Continued)

(56) References Cited

U.S. PATENT DOCUMENTS 7,945,349 B2 * 5/2011 Svensson ............... B25J 9/1692
901/6
9,811,074 B1   11/2017 Aichele et al.
(Continued)

OTHER PUBLICATIONS

Int'l Search Report (Form PCT/ISA/220) conducted in counterpart Int'l Appln. No. PCT/AT2018/060285 (dated Feb. 21, 2019).
(Continued)

*Primary Examiner* — Andy Ho
(74) *Attorney, Agent, or Firm* — GREENBLUM & BERNSTEIN, P.L.C.

(57) ABSTRACT

The invention describes a robot (5) and/or robot controller (17) and a method for validation of programmed workflow sequences or teaching programs (20) of a robot (5) preferably with a robot controller (17), wherein the robot (5) is preferably mounted on or next to a processing machine, in particular an injection molding machine (4), and serves for the extraction, handling, manipulation or further processing of injection-molded parts (3) which have just been produced. The travel parameters, equipment features and functionalities of the physical robot (5) are stored in a configuration file (27) on the control side. The robot controller (17) creates a virtual robot model (21) from these stored data. For validation of a workflow sequence, the robot controller (17) uses the current teaching program (20) in the robot controller (17) whereby the visualization of the workflow sequence
(Continued)

is displayed directly on an output unit of the robot controller (17).

11 Claims, 4 Drawing Sheets

(58) Field of Classification Search
USPC .......................................................... 703/6, 7
See application file for complete search history.

(56) References Cited

U.S. PATENT DOCUMENTS

| | | | |
|---|---|---|---|
| 10,525,594 B2* | 1/2020 | Ogata | B25J 9/1666 |
| 2011/0106284 A1* | 5/2011 | Catoen | B29C 45/76 |
| | | | 700/200 |
| 2015/0151431 A1 | 6/2015 | Suyama et al. | |
| 2015/0379171 A1 | 12/2015 | Kuwahara | |
| 2018/0104875 A1* | 4/2018 | Hoeglinger | B29C 45/80 |
| 2019/0030715 A1* | 1/2019 | Tarui | B25J 9/163 |

OTHER PUBLICATIONS

Int'l Written Opinion (Form PCT/ISA/237) conducted in counterpart Int'l Appln. No. PCT/AT2018/060285 (dated Feb. 21, 2019).

* cited by examiner

METHOD FOR VALIDATING PROGRAMMED EXECUTION SEQUENCES OR TEACHING PROGRAMS FOR A ROBOT IN A WORKING CELL, AND A ROBOT AND/OR ROBOT CONTROLLER FOR SAID METHOD

BACKGROUND

1. Field of the Invention

The invention relates to a method for validation of freely programmed workflow sequences of robot sequences, whereby it is possible to switch at any time between validation on a physical robot and a virtual robot.

2. Description of the Background

Workflow sequences of industrial robots are typically first programmed directly with the aid of the robot controller or created on an external computer, in which case the physical positions in space must be defined in a second step. These definitions can also be made as part of the validation of the workflow sequence. Likewise, the validation of the sequence for future automatic operation is carried out after program creation either directly on the physical robot or in two separate steps. In the first step, the basic sequence is verified offline on the external computer, and in a further step it is on the physical robot to check the correctness of the positions and hardware functions.

A disadvantage of validation directly on the robot is that the axis movements must be performed on the physical robot and thus collisions with components in the work cell can occur, even if the validation is typically performed at reduced speed. Furthermore, this validation is limited to program paths that are defined by current operating states. Offline validation on an external computer, on the other hand, has to be criticized for the limited visualization of the actual conditions, as well as the requirement for a high degree of imagination on the part of the operator with regard to the robot's overall workflow in the context of its environment. This again leads to an increased risk of collision during actual validation on the object after the workflow sequence has been transferred to the physical robot.

SUMMARY

The objective of the present invention is therefore to create a method for a robot and/or robot controller of the type mentioned above, whereby on the one hand the disadvantages described above are avoided and on the other hand the operational safety of the robot work cell is increased.

The objective is achieved by the invention.

The method according to the present invention is characterized in that the travel parameters, equipment features and functionalities of the physical robot are stored in a configuration file on the control side, and the robot controller creates a virtual robot model from these stored data and accesses the current teaching program in the robot controller for validation of a workflow sequence, wherein the visualization of the workflow sequence is displayed directly on an output unit of the robot controller. The advantage here is that program creation and validation on the physical and virtual robot can be carried out at one location, the output unit of the robot controller. This allows the machine operator to easily detect and correct any problems in the process directly at the robot controller and without endangering the physical robot or components in the work cell. It is also possible to simulate and select any states of external peripheral inputs to the robot controller or robot control system, respectively, or other influences on the program sequence in order to simulate the robot's reactions to special states and to test the workflow sequence in all situations for correctness, in particular for avoidance of collisions. For easy detection of a potential collision or incorrect programming, it is important that the physical robot executes the current program sequence as far as possible until a possible collision situation occurs and only then switches to the virtual robot model with simulation of dangerous states. With the solution according to the present invention, it is possible to switch between the validation of the physical robot and the validation and thus continuation of the process in the virtual robot at any time and in any operating state. With this switchover, the virtual robot model, which up to now has followed the physical model internally, is decoupled and can continue in any sequence on the output unit of the robot controller.

For a meaningful and effective validation, it is important that the virtual robot model accesses the configuration data of the physical robot and thus provides all the functions of the physical robot, as well as the correct motion profiles of the individual axes. This allows time-critical functions and/or combinations of time-dependent functions to be simulated on the virtual robot model.

Advantageous embodiments are such in which the relevant dimensions of the processing machine and other components, in particular grippers for the manipulation of the injection-molded parts, conveyor belts, automation systems, mills, protective enclosures, etc., which together with the physical robot form a work cell and are essential for interaction with the robot, are either digitally transmitted to the robot controller or queried, respectively, or determined by means of measuring devices, and are included by the robot controller in the validation to detect possible collision states. On the one hand, this ensures that all the data of the dimensions, in particular of the interfering contours, are transmitted or available, respectively, in the robot controller, which are included by the robot controller in the virtual representation of the robot, so that the machine setter can immediately see visually where problems, in particular collisions, can occur. Depending on the presence and quality of the transmitted contour data of the external components of the work cell, the robot controller can also independently indicate potential collision points. On the other hand, it is also possible that external components in the work cell do not transmit contour and position data to the physical robot, as they do not have a corresponding interface or knowledge of their own data, respectively. As an option, the physical robot can be equipped with appropriate measuring devices, which either determine the objects in the working area of the robot in a learning mode or learn them continuously during operation, so that the robot builds up a complete image of the work cell over time. However, it must be mentioned that the method according to the present invention can be applied even without knowledge of the working environment of the robot and contributes to an increase in operational safety, thus achieving the desired result.

Advantageous embodiments are also such in which the virtual robot model can be decoupled from the physical robot in any operating mode of the physical robot and in any command line of the teaching program, and be used for validation. This ensures that critical partial sequences of the workflow sequence are first checked in a virtual manner for correctness and only then the physical robot is switched on. On the other hand, uncritical, longer partial sequences can be quickly passed through. Concomitantly with the validation, the operator can, if necessary, make an optimum adjustment to the programmed sequence, in particular the teach-in program. A major advantage, however, is that this makes troubleshooting much easier and faster, as the machine setter can view and effect everything on the robot controller directly on site at the plant, and thus focus on the validation of critical points in the process.

Advantageous embodiments are such in which the virtual robot is coupled with the physical robot at any time after decoupling and virtual validation of certain commands and partial sequences in the teaching program and thus reset to the identical state of the physical robot, in order to validate further partial sequences of the teaching program after a new decoupling. This allows maximally fast repetition of various processes or simulation of different states on site at the plant and checking of other processes for optimization and/or troubleshooting.

Advantageous embodiments are such in which programmed or determined movement spaces of the physical robot are represented spatially and in color in the virtual robot model in order to make permitted travel and movement areas detectable for the operator.

Advantageous embodiments are such in which the operator has the possibility in the virtual robot model to influence the workflow sequence of the movement and function sequences by manually changing peripheral states and thus to test sequences that would be difficult to simulate with the physical robot. In this way, even program sequences can be checked in a virtual manner for correctness that would be executed only in exceptional cases. Likewise, the logic of linking conditions to continuation in the workflow sequence can be checked.

Embodiments in which the virtual robot model executes the teaching program in accelerated time, i.e. in fast motion, are also advantageous. Typically, the robot performs essentially the same movements in a production cycle. However, for example, stacking parts into a crate leads to slightly different movements each time, as the filling level of the crate is increased with each production cycle. Thanks to the possibility of running the entire production cycle for filling an entire crate on the virtual robot model in fast motion, even problem situations that do not occur in the first cycle can be detected within a very short time. In particular when stacking injection-molded parts, the situation arises that at the beginning, i.e., when the crate is empty, the robot needs a longer travel distance than when the crate is almost full. The problematic situation with the then given states of the robot are then pointed out to the operator on the virtual model.

It is advantageous to operate the virtual robot model in such a way that all or some of the possible branchings that execution of a teaching program can take are automatically detected and tested by the virtual robot model in fast motion without further user interaction. If a potential collision is detected in the path of the robot, the situation on the virtual robot model on the robot controller is made clear to the user, and the teach command line causing the collision is pointed out.

Further advantageous embodiments are such in which the possibility of running the virtual robot model in fast motion is used to estimate the expected cycle time, i.e. the time for the extraction and depositing of the produced part until the robot returns to the extraction position above the injection molding machine, can be estimated immediately or even continuously updated during the teach-in process. The cycle time to be achieved is often known in advance. The quick estimation by using the virtual robot model in fast motion allows the teach-in process to be optimized for achieving or undercutting this time, whereby the time required by the operator for this is significantly reduced by the fast motion.

Embodiments that test the virtual robot model already at the speed intended for later operation, typically 100% of the design speed, are also advantageous. In contrast to the situation with e.g. welding robots, the exact speed-independent path accuracy of the extraction robot is generally not important for the extraction of plastic parts. Much more important is the fast dynamic changeability, i.e. recalculation, of the path in the event of sudden events (e.g. loss of parts, active switching of a danger zone) while maintaining the load limits of the mechanics. This can be achieved by a low-pass filter, which is applied to the calculated web before it is fed to the drive controllers. However, this filtering also means that the actual path deviates slightly (shortening) from the calculated path, for example when rounding movements. In extreme cases, a danger area usually defined as a cuboid may be violated. This situation can be simulated in advance by the virtual robot model, if desired also in fast motion. Any violations can then be explained to the user on the virtual robot model.

Similarly, advantageous embodiments are such where teaching programs that have not been taught independently of speed, but are consciously or unconsciously subject to time control, can be simulated with the virtual robot model. Possible problem situations can then be detected either visually by the user by observing the three-dimensional model visualized on the robot controller or by detection of collision situations.

As described above, the virtual robot model can be operated in a simulated manner in various operating modes. The selection of the operating modes can be selected and adjusted via the robot controller, in particular the screen keys and/or touch screen. By activating the fast motion function, several, in particular a large number of production cycles can be checked in a short time.

Advantageous embodiments are such where the virtual robot is part of a virtual work cell and other devices of the work cell such as injection molding machine, extraction gripper, sprue gripper, conveyor belt and other peripheral and automation components are represented in the context of the virtual robot and can optionally be considered in the validation. This ensures that all components whose functions, sizes or dimensions, respectively, could be important in the program creation or workflow sequence are displayed on the robot controller, thus providing the operator with a more complete image of the physical work cell. This serves essentially to simplify operation and to improve the visual representation of a cell.

Advantageous embodiments are such in which it is possible to zoom into the visualization of the work cell, whereby the perspective can be freely selected and changed at any time. This ensures that in any case optimum view of any problem areas can be achieved, whereas the physical system will often not permit the machine setter to get any arbitrary view. In particular, zooming into rooms into which the machine setter actually has no view has proven to be very advantageous, since whenever faults occur in these areas, it is very difficult and time-consuming to find them on physical systems.

An additional advantage is the possibility of creating the teaching program on an external computer or to transfer it there from the robot controller. Likewise, the configuration file with the essential settings of the physical robot can be transmitted to the external computer, enabling offline checking of the workflow sequence. This ensures that checking or analysis, respectively, can be carried out also offline, away from the plant.

Furthermore, the objective of the present invention is achieved by a robot controller in which the travel parameters, equipment features and functionalities of the physical robot are stored in a configuration file, wherein the robot controller accesses this configuration file to create a virtual robot model and accesses the current teaching program in the robot controller for validation of a workflow sequence, wherein the visualization of the workflow sequence can be displayed directly on the robot controller.

The advantage here is that user-friendliness is considerably increased, since all processes can be carried out directly on the system via the robot controller using the virtual robot model. This allows the robot's traverse paths to be checked and verified, and any problem areas to be detected or found, respectively, in the virtual robot model. It is also possible that a virtual collision of the robot with another component is automatically detected and displayed or a warning signal is sent, respectively.

Basically, it can be said that the solution according to the present invention ensures that before the start of the automatic operation of the robot, extensive checking of all possibilities of the workflow sequence can be carried out and thus all potential sources of error can be easily detected and eliminated.

BRIEF DESCRIPTION OF THE DRAWINGS

The invention will now be explained in more detail by reference to several exemplary embodiments illustrated in the drawings.

The figures show.

DETAILED DESCRIPTION

It should be stated by way of introduction that, in the individual embodiments, the same parts are provided with the same reference numbers or same component designations, wherein the disclosures contained in the entire description can, by analogy, be transferred to identical parts with identical reference numbers or identical component designations, respectively. The position details selected in the description, such as, e.g., top, bottom, lateral, etc., likewise relate to the figure described, and in the event of a change of position, they are to be transferred to the new position by analogy. Individual features or feature combinations from the exemplary embodiments shown and described may also represent independent inventive solutions.

Figure 1:
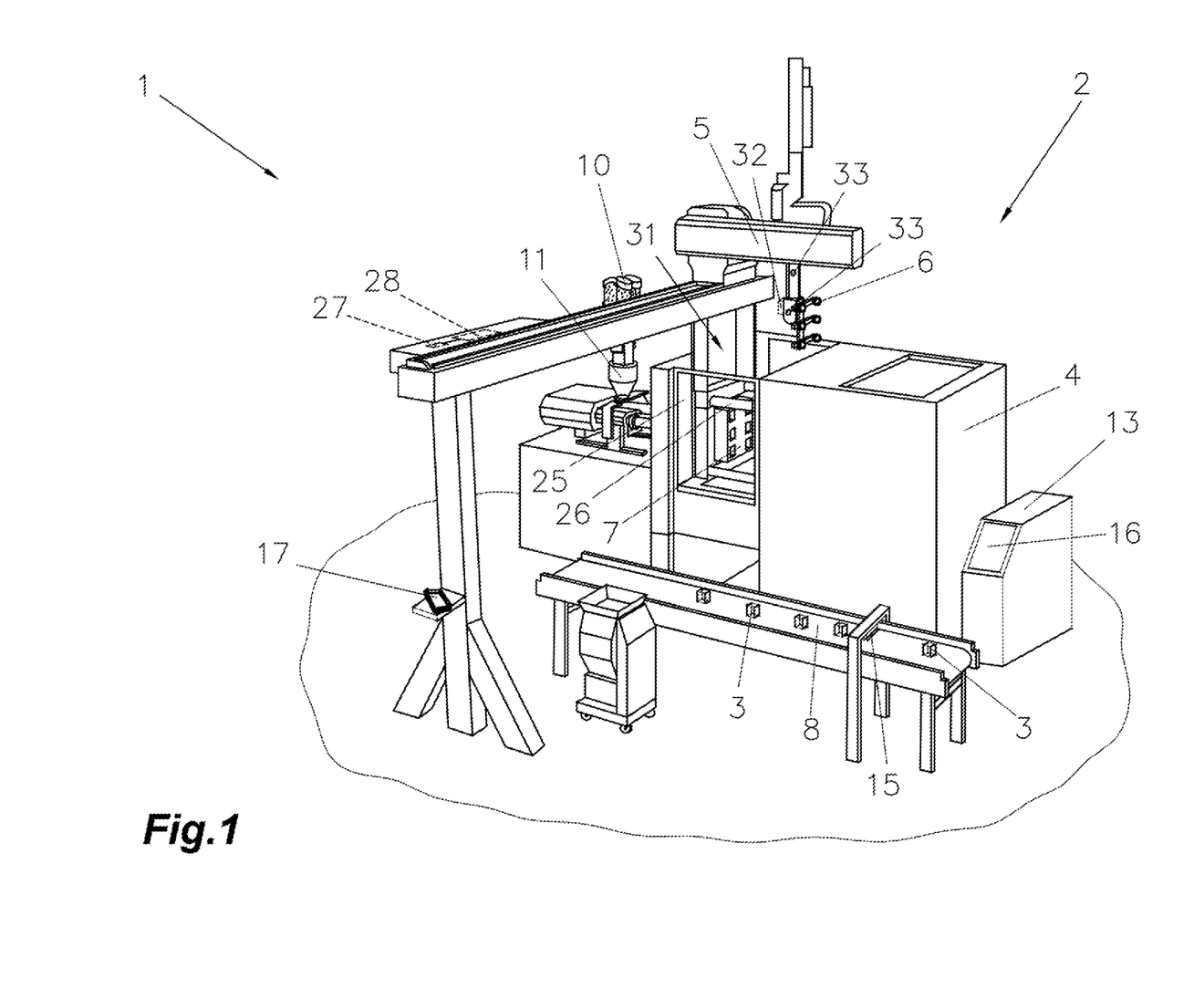
FIG. 1—an overview illustration of a plastics-processing industrial installation, simplified, for illustrative purposes only.

FIG. 1 shows an industrial installation 1, in particular a work cell 2 for injection molding applications, in which the individual components/devices for producing one or several products/semi-finished products or injection-molded parts 3 are connected together in work cell 2. The processing machine preferably used is an injection molding machine 4, to which a robot 5 or automatic handling robot, respectively, is assigned for removing the produced injection-molded part 3, wherein the injection-molded part 3 is taken from an opening injection mold 7 by an extraction device 6, in particular a gripper equipped with gripping tongs or suction nozzles, and deposited on a device, in particular a conveyor belt 8. In order to be able to produce an injection-molded part 3, plastic granules 9 are fed to the processing machine 4 via a granules-conveying device 10 and possibly via a metering device 11. By means of a temperature control unit 13 and/or cooling unit, the injection mold can be kept at operating temperature by feeding a temperature control medium or heated or cooled accordingly, respectively, so that optimum processing of the plastic granules 9, which must be plasticized for injection into the injection mold 7, is made possible. In addition, the plant is equipped with a monitoring device 15, in particular a camera system, in order to be able to carry out an automatic quality control of the produced product 3. In order for the individual devices to be adjusted or programmed, respectively, they have corresponding control electronics, which are entered and displayed via displays 16 or a robot controller 17 arranged on the devices. For the sake of completeness, it is also mentioned that all devices are connected to corresponding lines, in particular power supply, network lines, liquid supply lines, material lines, etc., which in the interest of clarity were not displayed in the representation shown.

Figure 2:
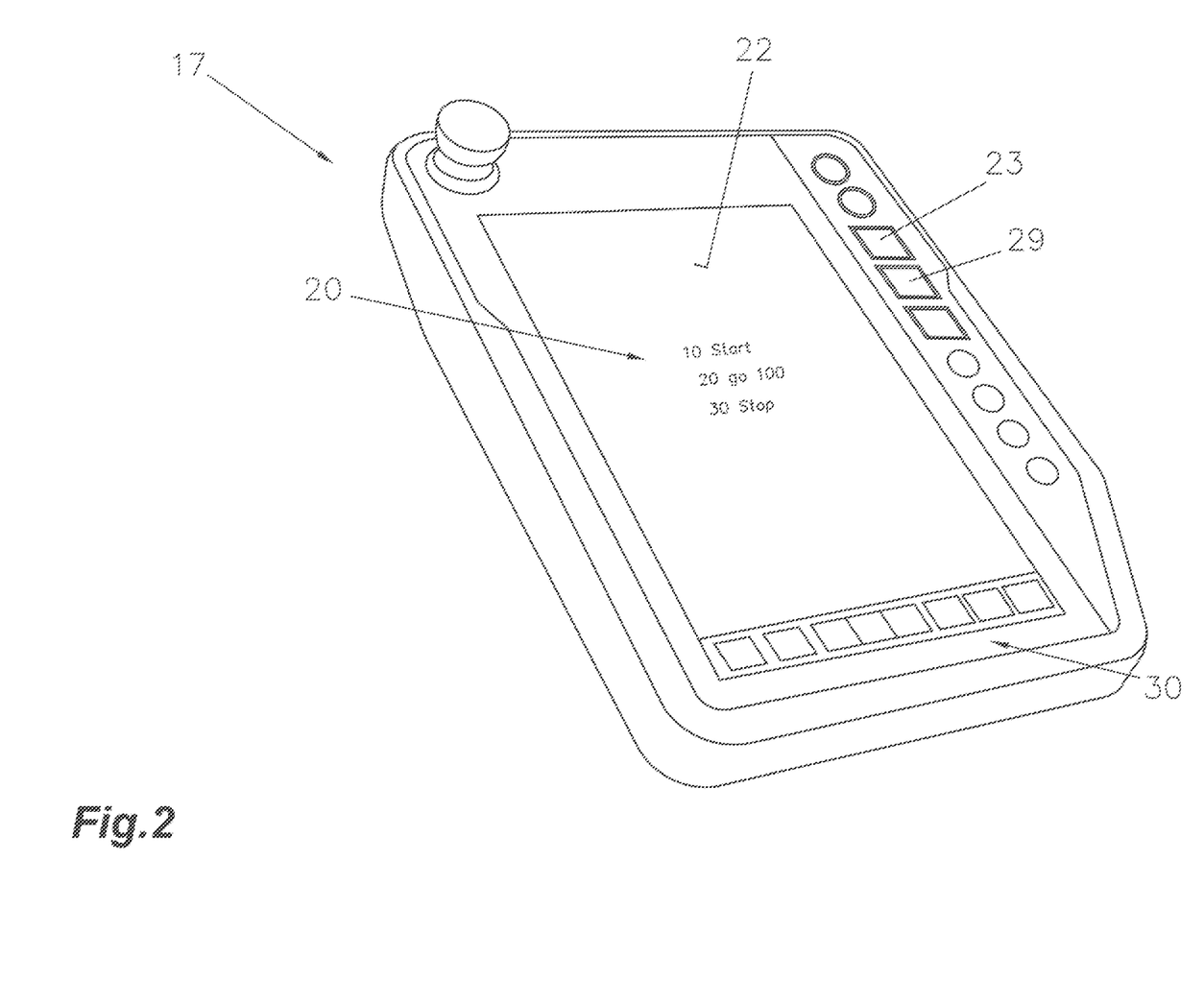
FIG. 2—a schematic representation of a TeachBox as part of a robot controller—for program creation, simplified, for illustrative purposes only FIG. 3—a schematic representation of a virtual robot model on a robot controller, simplified, for illustrative purposes only.
Figure 3:
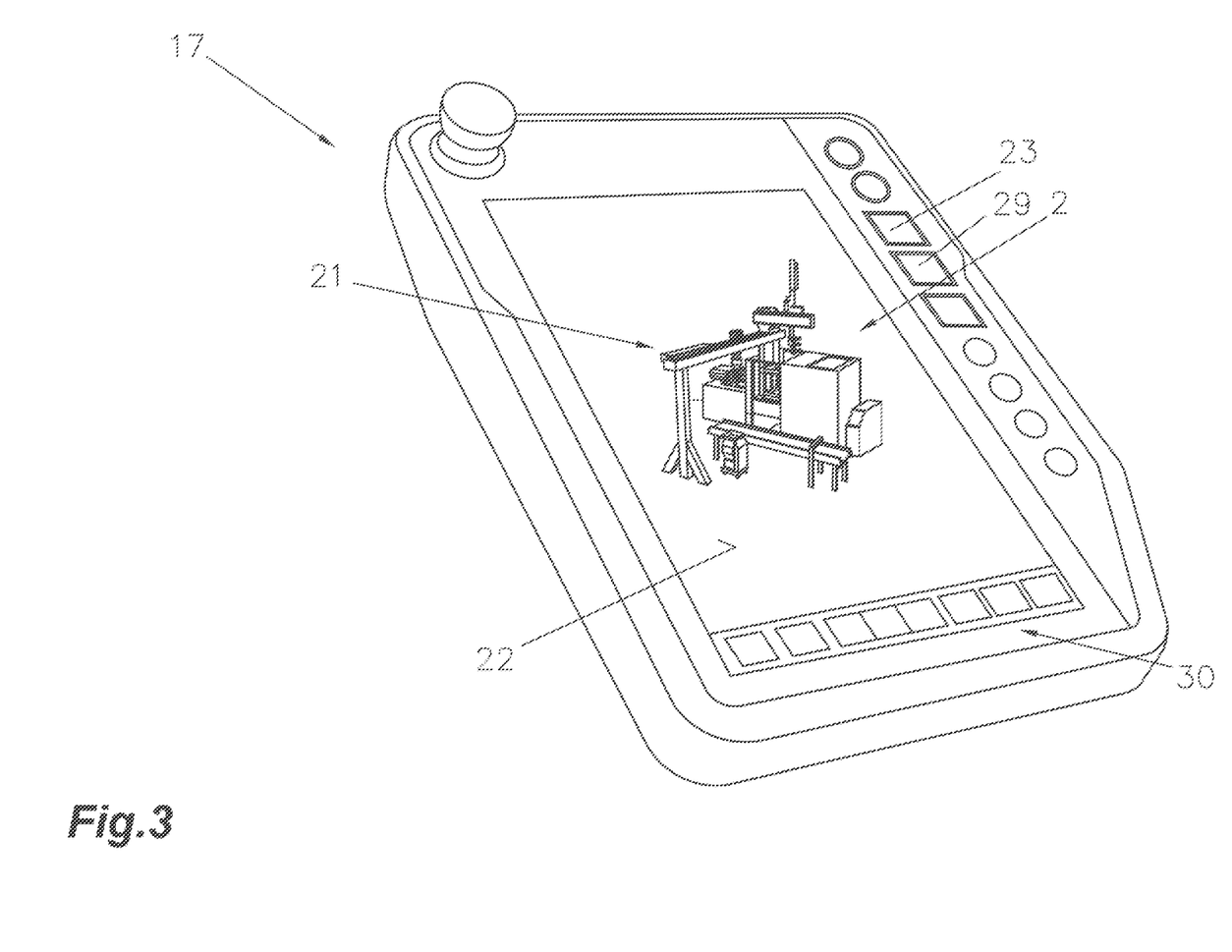
Figure 4:
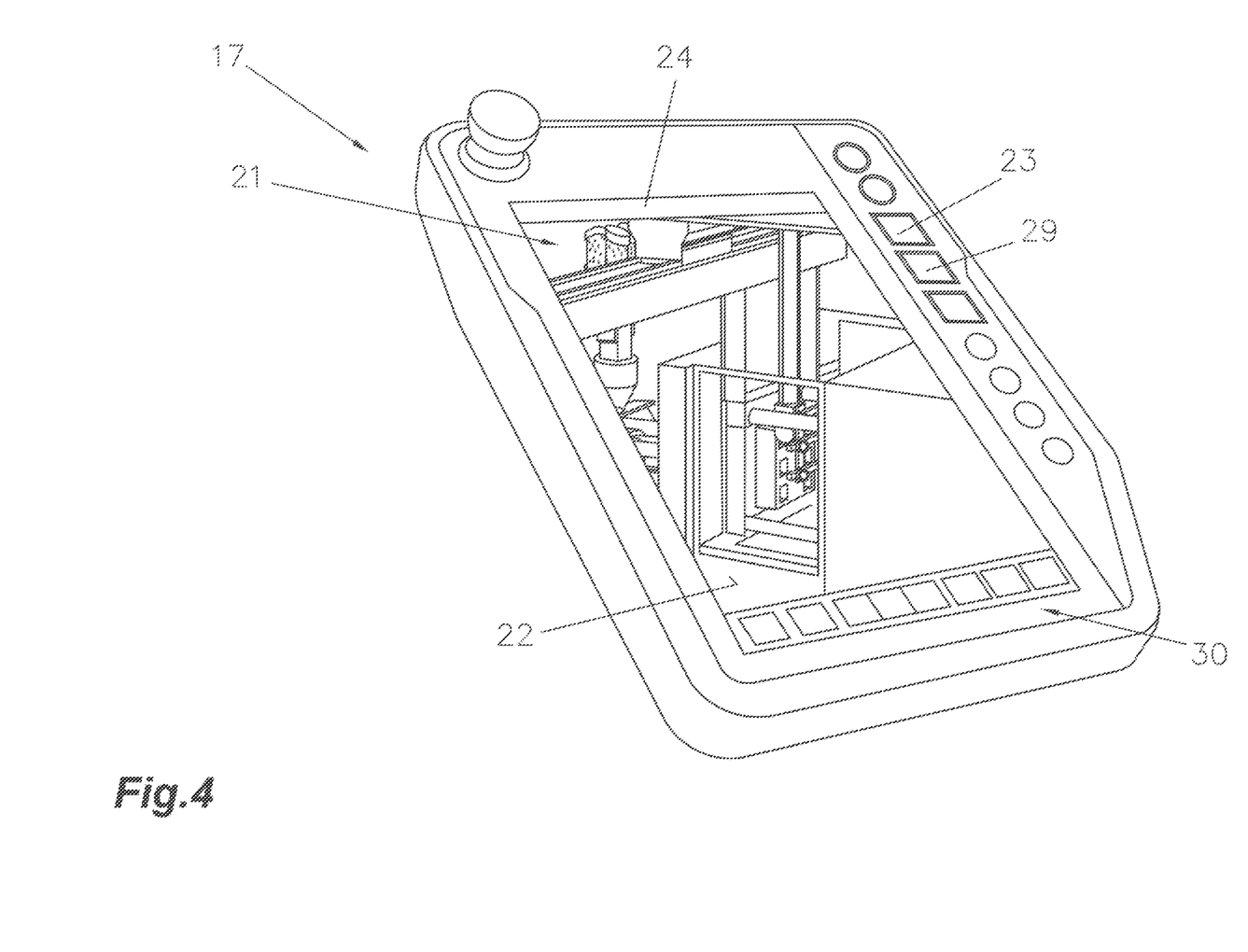
FIG. 4—is a schematic representation of the robot model in enlarged perspective and changed position of the robot, where the extraction device is extended into the opened tool for removing the produced injection-molded part.

According to FIGS. 2 to 4, a method and a robot 5 and/or robot controller 17 are described according to the present invention, in which validation of programmed workflow sequences or teaching programs 20 of the robot 5 or handling robot, respectively, can be carried out preferably with the robot controller 17. The robot 5 is preferably mounted on or next to the processing machine, in particular the injection molding machine 4, and serves for the extraction, handling, manipulation or further processing of injection-molded parts 3 which have just been produced.

The robot controller 17 is designed to reproduce a virtual twin or virtual robot model 21 (according to FIG. 3), in particular a virtual representation of the plant or work cell, respectively, at the output location, in particular a touch screen 22, whereby preferably all production resources of the plant or work cell 2 are shown. The creation of the virtual general view can preferably be carried out automatically, whereby the required data are read out from the individual components by the robot controller 17. The virtual robot model 21, the so-called "digital twin", is in any case automatically created from the configuration file 27 of the robot controller 17. Here it is also possible that, on the basis of stored and read-out identifiers or type designations of the devices, respectively, corresponding virtual models, in particular their shape and dimensions, are stored in the storage system of the robot controller 17, or that data for the design, in particular the arrangement, the position and the function, as well as a digital representation of the production resources are stored in the individual recorded production resources, which can be queried by the robot controller 17 and/or the robot 5 via a processing network.

The robot controller 17 is equipped with the latest hardware and software technologies with regard to increased performance and operational safety. This makes it possible that a digital robot twin, i.e. the virtual robot model 21, is available by default on the robot controller 17, which allows validation of the workflow sequences to be executed by the real robot 5 at any time in a virtual manner and thus to check the workflow sequences before start-up without risk to the processing machine and robot 5, as shown in the illustrations in FIG. 3 and FIG. 4, where the extraction device 6 of the robot 5 from the position above the injection mold 7 of the injection molding machine 4, according to FIG. 3 is extended into the opened injection mold 7 of the injection molding machine 4, according to FIG. 4.

It is essential that the robot controller 17 makes the actual specifications of the stored teaching program 20 available to the virtual robot model 21, so that the actual process is represented on the virtual robot model 21.

The robot controller offers a display area of, for example, 10.1" in portrait format and has a capacitive touch surface on touch screen 21 that follows the current tablet trend. This now also allows gesture control, in particular wiping for changing sides and zooming with two fingers (as was done in FIG. 4), which makes operation of the robot controller 17 even more intuitive. Preferably, the robot controller 17 has several multi-core processors, which allow optimal task sharing and thus improve performance. Time- or safety-relevant processes, respectively, can be completely decoupled from the visualization level in order to realize maximum operational safety and the fastest possible reaction to critical events.

Based on the programming, i.e. the stored teaching program 20, the robot controller 17 generates a virtual work cell or the robot model 21, respectively, in whose visualization it is possible to zoom, whereby the perspective is freely selectable and can be changed at any time, i.e. during a simulation, i.e. a virtual sequence of machine settings, the view of the displayed robot model 21 can be changed at any time to control areas that are not visible in this way. It is also possible to zoom into the displayed model, so that only a part of the virtual robot model 17 is visible, but the simulation is continued, so that all processes become visible again when you reduce the size.

It can therefore be said that a digital copy, i.e. a digital twin or virtual robot model 21, of the actual work cell 2 or robot 5, respectively, is carried along or simulated in the robot controller 17 or the robot controller 17 is designed to display the virtual robot model 21 accordingly. This virtual robot model 21 has the same equipment features and characteristics as the real existing robot 5, and thus allows a realistic simulation of the application-specific processes.

It is always possible to check sequences when programming a teaching program 20, i.e. as soon as corresponding parts of a robot program or teaching program 20, respectively, have been created, it is possible to switch to simulation mode via the test menu of the robot controller 17, which can be called up, for example, by activating a button 23, and to check the partial sequence that has just been created. In order to clearly distinguish the virtual robot model 21 on the touch screen from the real equipment, i.e. the physical robot, a bright status line 24 preferably appears on the screen of the robot controller 17 in this mode, and the virtual robot is also shown in a schematic representation.

The simulation mode also allows simulation of the injection molding machine 4 on the basis of stored parameters, which are queried by the robot controller 17 and read out e.g. from a storage system in the injection molding machine 4. Of course, it is also possible to simulate other components or to read out their data and implement them in a virtual manner, respectively.

The simulation mode thus enables the operator or machine setter, respectively, to detect any serious errors in the robot program 20 very quickly, without having to take any risks during an actually performed test run. Movement sequences of high complexity, which are composed of up to six simultaneous movements, such as the movements of all robot axes and additional axes, such as rotary axes, and which could lead to a collision of robot 5 with the protective enclosure 25 or the tie bars 26 of injection molding machine 4, can thus be easily checked so that they lose their programming "horror". In this way, errors in the flow logic can be detected during simulation, as well as potential synchronization problems with superimposed and simultaneously running functions.

The virtual robot model 21 is available in every operating mode for the entire process, i.e. also in the so-called "dry operation" and manual or single-step mode, respectively. It is also possible for the robot controller 17 to activate its anti-collision control in manual mode and during a dry cycle. This permanently reports the current consumption of each individual drive. If there are too many deviations from the standard value and thus collision of robot 5 with other components in work cell 2 is highly probable, the drives are switched off immediately. Thus, the actual values can be displayed or shown on the virtual robot model 21 for the corresponding parts, i.e. that, for example, if a drive has a critical current consumption, it is colored red in the virtual robot model 21 so that the operator or machine operator, respectively, can see where the limit values are exceeded or where there are problems. It is possible to have corresponding ranges for the parameter values stored and saved, respectively, so that the corresponding parts are colored appropriately. This increases user-friendliness considerably, i.e. when defined limit values, i.e. the adjustable parameters, are exceeded, the corresponding components are displayed in the virtual robot model 21 in color, in particular red, or just the values are displayed.

As an advantageous and operationally reliable embodiment, it has been shown that in the robot 5 special data are stored in a configuration file 27, as schematically shown with dotted lines, whereby the configuration file 27 contains the travel parameters, equipment features and functionalities of the physical robot 5. For this purpose, the robot 5 accesses the configuration file 27 on the control side, in particular the data stored in it, so that, for example, the acceleration ramps of the individual axes are read out of the file by robot 5 and are thus used as nominal values during operation. The other parameters included are also used for the operation of robot 5, whereby additional data from robot controller 17 can also be used for operation.

In the same way, the robot controller 17 accesses the configuration file 27 and reads the data for the formation of the virtual robot model. For validation of a workflow sequence for the virtual robot or robot model 21, respectively, the robot controller 17, respectively, accesses the current teaching program 20 stored in it, whereby the visualization of the workflow sequence is displayed directly on the robot controller 17. In order to make this possible, a corresponding software is provided on the robot controller 17, whereby on the one hand the configuration file 27 and the stored teaching program 20 are accessed in order to combine the data and to create a functional virtual robot model 21 for simulation sequences on the robot controller 17.

Here, the virtual model 21 can be simulated on the robot controller 17 in any operating mode of robot 5. Here it is possible to simply jump back and forth between the teaching program 20 and the virtual robot model 21 via a toggle button 29, so that work can be performed on the teaching program 20 and the created sections tested immediately on the virtual robot model 21 by simply switching. It is also possible to decouple the virtual robot model 21 from the robot 5 in step mode and to use the corresponding keys 30 to have the teaching program 20 executed stepwise only by the virtual robot. Then the virtual robot model 21 and the physical robot 5 can be coupled again so that the virtual robot model 21 follows the robot 5 and for a new virtual validation of the following commands in teaching program 20, the virtual robot starts in the correct starting position.

The advantage here is that the user can change the perspective at any time and can also simply enlarge the robot model 21 in order to record the most accurate and optimal travel path. Here, too, it is possible to create only partial sequences, which are checked in the coupled state.

In order to provide optimum and simple control for the operator or machine setter, respectively, the possible movement spaces 31 can be color-coded so that it is immediately recognizable where the robot 5, in particular the extraction device 6, can be moved without collision. If, for example, the extraction device 6 overruns a movement space 31 marked in this way, the robot controller 17 stops all axis movements and optionally issues a corresponding warning signal, for example a beep tone or a flashing display of the model.

It is also possible that in the robot controller 17 virtual models of various components of the manufacturer and also of third-party products are stored, which are assigned to a corresponding identifier or type designation, respectively. This identifier or type designation, respectively, is stored in the individual components so that it can be queried by the robot controller 17 and then the corresponding virtual model is generated. It is also possible that for new devices the virtual models are stored in a file that can be read out by the robot controller 17 and stored in its database so that they are available for future use. It is also possible that the virtual models are stored in an external database and the robot controller 17 can load them into its storage system whenever required. As a matter of principle, it is possible for the operator or the machine setter, respectively, to freely position the virtual models, wherein it is preferable, however, to have corresponding data for the position recorded over a measuring cycle or stored data for the position.

To determine the positions of the interfering contours or the positions of the individual devices, respectively, the robot 5 can be equipped with a measuring device 32 having several sensors 33 to determine the distance, as shown schematically, so that by moving slowly in all spatial directions the positions of the devices and/or movement spaces 31 are determined and stored. These data are then integrated into the virtual robot model 21, and corrections can be made to the existing robot model 21 if so desired.

Furthermore, the virtual robot model 21 on the robot controller 17 enables the operator to influence the workflow sequence of the movement and function sequences by manually changing peripheral states and thus to test processes that would be difficult to simulate with the physical robot 5, i.e. processes can be tested that occur only rarely with the actual robot 5 and are therefore difficult to reproduce. This can be simulated on the robot controller 17 without switching off and interrupting the system.

It is also possible to have the virtual robot model 21 adjusted or started, respectively, in such a way that the teaching program 20 or parts of it is/are operated in accelerated time, in particular in fast motion. Thus, a large number of production cycles can be run through in a short time. It is also possible to freely select the number of production cycles to be run through. Preferably, the user or machine setter, respectively, can select from among differently defined speeds, such as 2×, 4×, 8×, or 16×, for the fast-motion function. For the sake of completeness, it is mentioned that of course a slow sequence, such as 0.7×, 0.5× or 0.3×, is also possible, or the speed for the fast-motion function can be freely set.

It is also possible that the virtual robot model (21) is operated in such a way that all or some of the possible branchings that execution of a teaching program can take are automatically detected and tested. This automatically allows all possibilities to be completely checked.

It is pointed out that the invention is not limited to the embodiments shown, but may comprise further embodiments.

The invention claimed is:

1. A method for validating programmed process sequences or teaching programs of a robot configured with a robot controller, the robot being a physical robot mounted on or next to an injection molding machine and for extraction, handling, manipulation or further processing of injection molded parts that have just been produced, the method comprising:
storing data comprising process parameters, equipment features, and functionalities of the physical robot on the control side in a configuration file;
using the robot controller in creating a virtual robot from the stored data and applying it to a current teaching program in the robot controller to validate a process sequence of the robot controller, with a visualization of the process sequence being displayed directly on an output unit of the robot controller, with the virtual robot of any command line of the teaching program from the physical robot being decoupled and is used for the validation of certain commands and sub-sequences in the teaching program for potential collisions or incorrect behavior;
with the virtual robot following the physical robot in a coupled state and with decoupling, this synchronization between the virtual robot and the physical robot is stopped, with the coupled physical robot executing the current program sequence up to a possible collision situation and only then is switching made to the virtual robot with a simulation of dangerous states; and
with the virtual robot, after the decoupling at any time coupled with the physical robot, is coupled and reset to an initial state in order to then validate further sub-sequences of the teaching program.

2. The method according to claim 1, wherein:
the relevant dimensions of the processing machine and other components, including grippers for manipulating the injection molded parts, conveyor belts, automation systems, mills, protective enclosures, which together with the physical robot form a work cell and are configured to interact with the physical robot, either transmitted or queried digitally to the robot controller or determined with the aid of measuring devices and are included by the robot controller in the validation for the detection of possible collision states.

3. The method according to claim 1, wherein:
programmed or determined areas of movement of the physical robot are represented spatially and in color in the virtual robot in order to make permitted areas of movement and movement recognizable for an operator.

4. The method according to claim 1, further comprising:
an operator of the virtual robot or the physical robot on the robot controller having an option of manually changing peripheral states, a sequence of movement and influencing functional sequences and thus testing processes.

5. The method according to claim 1, further comprising:
processing with the virtual robot the teaching program in accelerated time, that is, in a time lapse.

6. The method according to claim 1, further comprising:
operating the virtual robot in a way that all or some of branches a teaching program processing can take are automatically recorded and tested.

7. The method according to claim 1, wherein:
the virtual robot is part of a virtual work cell and other devices of the work cell selected from among an injection molding machine, a removal gripper, sprue tongs, a conveyor belt and peripheral and automation components in a context of the virtual robot, any of which are configurable to be taken into account in the validation of the validation of programmed process sequences or teaching programs.

8. The method according to claim 1, further comprising:
zooming into the visualization of the work cell, the perspective being freely selectable and being able to be changed at any time.

9. The method according to claim 1, wherein:
the configuration file and the teaching program is configured to be transferred to an external computer and thus an offline check of the process sequence is possible.

10. A robot and/or robot controller for validating programmed process sequences or teaching programs of a robot, the robot being mounted on or next to an injection molding machine and for extraction, handling, manipulation or further processing of injection molded parts that have just been produced, travel parameters, equipment features and functionalities of a physical robot are stored in a configuration file, the robot controller for creating a virtual robot from the configuration file and for validating a sequence for a current teaching program in the robot controller, wherein the visualization of the sequence can be displayed directly on the robot controller, the virtual robot after decoupling and validation of certain commands and the rapid sequences in the teaching program can be coupled to the physical robot at any time and can be reset to an initial state in order to then validate further partial sequences of the teaching program in the coupled or decoupled state.

11. The robot and/or robot controller according to claim 10, wherein:
the robot and/or the robot controller is configured to carry out a method for validating programmed process sequences of teaching programs of the robot configured with the robot controller, the robot being the physical robot mounted on or next to the injection molding machine and for removal, handling, manipulation or further processing of injection molded parts that have just been produced, the method comprising:
storing data comprising process parameters, equipment features, and functionalities of the physical robot on the control side in the configuration file;
using the robot controller in creating the virtual robot from the stored data and applying it to the current teaching program in the robot controller to validate a process sequence of the robot controller, with a visualization of the process sequence being displayed directly on an output unit of the robot controller, with the virtual robot of any command line of the teaching program from the physical robot being decoupled and is used for the validation of certain commands and sub-sequences in the teaching program for potential collisions or incorrect behavior;
with the virtual robot following the physical robot in a coupled state and with decoupling, this synchronization between the virtual robot and the physical robot is stopped, with the coupled physical robot executing the current program sequence up to a possible collision situation and only then is switching made to the virtual robot with the simulation of dangerous states; and
with the virtual robot after the decoupling at any time coupled with the physical robot is coupling and resetting to an initial state in order to then validate further sub-sequences of the teaching program.

* * * * *